US 6,721,224 B2

(12) United States Patent
Eaton et al.

(10) Patent No.: US 6,721,224 B2
(45) Date of Patent: Apr. 13, 2004

(54) MEMORY REFRESH METHODS AND CIRCUITS

(75) Inventors: Steve S. Eaton, San Jose, CA (US); Michael Murray, San Jose, CA (US); Li-Chun Li, Los Gatos, CA (US)

(73) Assignee: Mosel Vitelic, Inc., Hsin-Chu (TW)

( * ) Notice: Subject to any disclaimer, the term of this patent is extended or adjusted under 35 U.S.C. 154(b) by 22 days.

(21) Appl. No.: 10/228,530

(22) Filed: Aug. 26, 2002

(65) Prior Publication Data

US 2004/0037142 A1 Feb. 26, 2004

(51) Int. Cl.[7] .................................................. G11C 7/00
(52) U.S. Cl. ...................... 365/222; 365/233.5; 365/236
(58) Field of Search ............................. 365/222, 223.5, 365/236, 233, 189.01

(56) References Cited

U.S. PATENT DOCUMENTS

| | | | |
|---|---|---|---|
| 5,548,560 A | 8/1996 | Stephens, Jr. et al. | 365/233.5 |
| 6,101,133 A | 8/2000 | Lim | 365/189.04 |
| 6,226,757 B1 | 5/2001 | Ware et al. | 713/503 |
| 6,275,437 B1 | 8/2001 | Kim et al. | 365/222 |
| 6,285,578 B1 | 9/2001 | Huang | 365/154 |
| 6,298,000 B1 | 10/2001 | Kitade et al. | 365/222 |
| 6,298,005 B1 | 10/2001 | Landry | 365/233 |
| 6,356,473 B1 | 3/2002 | Shimoyama | 365/49 |
| 6,356,484 B2 | 3/2002 | Dosaka et al. | 365/189.01 |
| 6,366,515 B2 | 4/2002 | Hidaka | 365/222 |
| 6,587,389 B2 * | 7/2003 | De Paor et al. | 365/222 |
| 2001/0026493 A1 | 10/2001 | Leung | 365/222 |
| 2002/0027820 A1 | 3/2002 | Mizugaki | 365/222 |

OTHER PUBLICATIONS

Zitlaw, Cliff, "Putting the squeeze on memory", RF cover story, Nov. 2001, pp. 50, 54, 56, and 58.
Toshiba Announces Industry's First 64Mb Pseudo SRAM Family, PSRAMs Ideal For Use in Next–Generation Wireless and Portable Devices, http://www.toshiba.com/taec/press/to–168.shtml, Dec. 14, 2001, pp. 1–3.
Samsung Electronics, K1S321615A, UtRAM, "2M×16 bit Uni–Transistor Random Access Memory", Mar. 2002, Revision 1.0, pp. 1–12.
Samsung Electronics, K1S321615M, UtRAM, "2M×16 bit Uni–Transistor Random Access Memory", May 2001, Revision 3.0, pp. 1–12.
Toshiba TC51W3216XB, Toshiba MOS Digital Integrated Circuit Silicon Gate CMOS, "2,097,152–Word By 16–Bit CMOS Pseudo Static RAM", Jun. 22, 2001, pp. 1–9.

* cited by examiner

Primary Examiner—David Lam
(74) Attorney, Agent, or Firm—Michael Shenker; MacPherson Kwok Chen & Heid LLP (57) ABSTRACT

A memory performs a hidden refresh only at the end of a read operation or when the memory is disabled but is supposed to retain data in the disabled state. When the memory is in the enabled state, the refresh is not performed at the end of any operation other than read. This is done to ensure that execution of any memory access command will not be delayed by a refresh as long as the user follows certain timing rules. Other embodiments are also provided.

26 Claims, 5 Drawing Sheets

MEMORY REFRESH METHODS AND CIRCUITS

BACKGROUND OF THE INVENTION

The present invention relates to memories, and more particularly to memory refresh operations.

Dynamic random access memory cells (DRAM cells) need to be refreshed from time to time to restore leaking charge. In older DRAMs, a refresh was initiated by the user (i.e. a system using the memory) by supplying appropriate control signals on the memory input terminals. Some more recent DRAMs hide the refresh from the user. Hidden refresh is desirable for example in pseudo static random access memories, also called pseudo SRAMs or PSRAMs. PSRAMs provide an SRAM-like interface to a DRAM based memory. SRAMs are faster than DRAMs, and SRAMs do not need a refresh, but they are more expensive (due to a larger size of an SRAM cell) and they consume more power. PSRAMs make it easier for a system manufacturer to replace an SRAM with a DRAM based memory.

In order to hide a refresh from the user, the memory access cycles can be extended so that each cycle can accommodate a refresh in addition to a memory access operation. This is inefficient however because the refresh operations can typically be performed less frequently than the memory access operations. In some systems, the refresh operations are hundreds of times less frequent than the memory access operations.

SUMMARY

This section summarizes some features of the invention. Other features are described in subsequent sections. The invention is defined by the appended claims.

In some embodiments of the present invention, the user has an option of extending only selected memory access cycles to accommodate a refresh. This option can be provided as follows. When a refresh becomes pending, the memory will only initiate the refresh at the end of a memory access operation. If there is no memory access operation in progress, the refresh will be postponed. Also, if the user issues a command to perform a memory access operation, but then issues a new command at the end of the memory access operation, the refresh will be postponed to allow the memory to execute the new command. The memory will not initiate the refresh until a time when no new command is pending at the end of a memory access operation.

In some embodiments, the user does not have to issue a new command to suppress a refresh at the end of the current command execution. The user can provide command signals identifying the new command without meeting the setup or any other minimum hold time requirements needed for the command to be issued. For example, in a PSRAM emulating an asynchronous SRAM, the user can suppress the refresh at the end of a current read operation simply by toggling an address input. The user can keep toggling the address input without meeting the setup requirements until the user issues a new command. Thus, the user has to provide an indication of a new command, wherein the indication can be defined as providing the command signals with or without meeting the setup or any other timing requirements.

The invention is not limited to memories with setup requirements. Also, an indication of a new command may involve meeting some of the setup requirements but not meeting other setup requirements.

The memory can be operated as follows. For each command, the user can choose whether the corresponding memory access cycle will be "long" or "short". A "long" cycle is sufficiently long to accommodate both a memory access operation and a refresh. A short cycle can only accommodate the memory access operation. A new command indication (e.g. a read command indication) is provided by the user at the end of the short cycle memory access operation to block a refresh if one is pending.

The user must periodically perform long cycles to allow a refresh to take place.

If the user makes each cycle either long or short, and periodically performs long cycles to allow a refresh, then the memory access operations are never delayed by a refresh in progress. Therefore, the short cycle timing is predictable. The long cycles can be performed only infrequently as needed to allow a refresh. Further, the refresh can be hidden since the user does not have to know when a refresh is pending and in which of the long cycles the refresh is performed.

In some embodiments, the refresh is performed only at the end of a read operation. The refresh is not performed at the end of write operations. The user is required to periodically perform long read cycles to allow a refresh.

In some embodiments, a refresh can also be performed when the memory is disabled. When the memory becomes enabled, the user is required to either delay memory access or perform a long cycle to accommodate a possible refresh that could have been started when the memory was disabled. If the long cycle is a read, the read data may be delayed since the read operation may be delayed by the refresh.

The above features are exemplary and not limiting. For example, in some embodiments, to suppress a refresh, a new command indication does not have to be issued at the end of the current operation but can be issued before the end of the current operation. Also, the memory may be pipelined to allow a refresh to be initiated before the end of the current operation. The memory may have additional features, e.g. externally initiated refresh capability (non-hidden refresh). The invention is defined by the appended claims.

DESCRIPTION OF SOME EMBODIMENTS

The timing, circuitry, and other particulars described in this section are for ease of illustration and arc not limiting.

Figure 1:
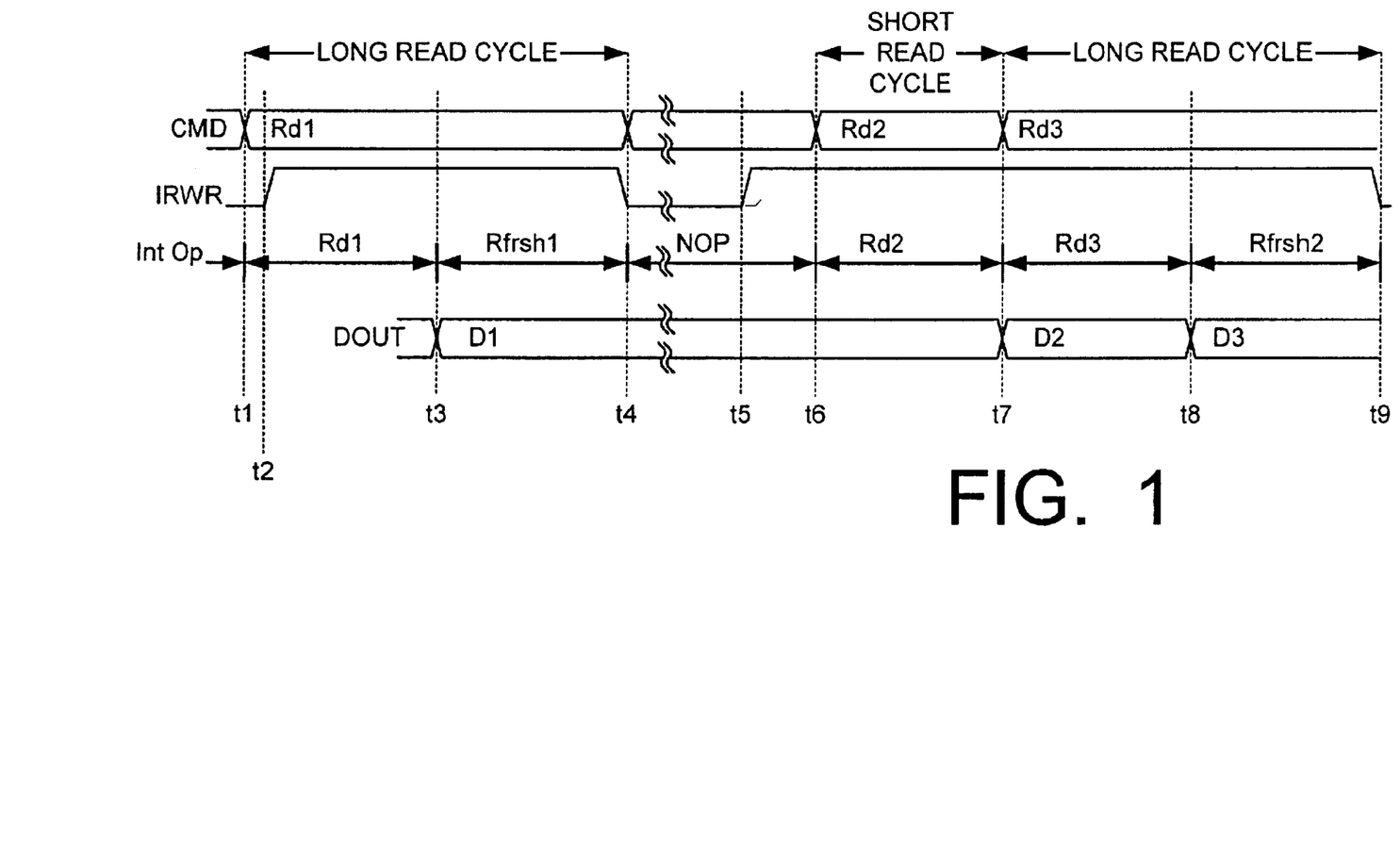
FIG. 1 is a timing diagram for one embodiment of the present invention.

FIG. 1 illustrates exemplary timing for one memory embodiment. Signal IRWR (Internal Refresh Was Requested) is high when a refresh is pending. IRWR becomes low when a refresh is performed.

Signal or signals CMD (command) can be any command signal or signals used to request a memory access operation. For example, in a PSRAM with an asynchronous SRAM interface, the CMD signals may include the address signals and also include WE\ (write enable), CE\ (chip enable), UB\ (upper byte), LB\ (lower byte), OE\ (output enable), or possibly other signals. (We use a slash "\" to indicate a signal active low. The invention is not limited to any signals being active high or low.) Asynchronous SRAMs are described in the following publications incorporated herein by reference: U.S. Pat. No. 6,275,437 issued Aug. 14, 2001 to Kim et al.; U.S. Pat. No. 6,366,515 issued Apr. 2, 2002 to Hidaka; U.S. Pat. No. 6,101,133 issued Aug. 8, 2000 to Lim; U.S. Pat. No.

6,356,473 issued Mar. 12, 2002 to Shimoyama; U.S. Pat. No. 6,298,005 issued Oct. 2, 2001 to Laundry; U.S. Pat. No. 5,548,560 issued Aug. 20, 1996 to Stephens, Jr. et al.; U.S. patent application Ser. No. 2001/0026493 published Oct. 4, 2001 (inventor Leung); U.S. patent application Ser. No. 2002/0027820 published Mar. 7, 2002 (inventor Mizugaki).

In some embodiments, CMD is a subset of the command signals. For example, CMD may consist of the address signals, CF\, UB\, LB\.

The "Int Op" diagram in FIG. 1 shows the intervals of time when internal memory operations are performed. "Dout" indicates output data (read data) on the memory output terminals.

At a time t1, a read command Rd1 is issued on the CMD lines, and a read operation Rd1 is initiated immediately as shown in the Int Op diagram. At a time t2, the signal IRWR is driven high to indicate a refresh is pending. At a time t3, the read data D1 becomes available on the Dout terminals. At about the same time, the read operation Rd1 is completed. The command lines CMD are unchanged, indicating no new command has been received from the user. Therefore, at time t3, a refresh operation Rfrsh1 is initiated. At a time t4, the refresh operation completes, and the signal IRWR becomes low. The Rd1 read cycle occurs from t1 and t4 as viewed on the CMD lines, and is a long read cycle.

Then at some time t5, IRWR becomes high again. The memory is not performing any operation (as indicated by NOP), but a refresh is not initiated. At a time t6, a read command Rd2 is issued on the CMD lines. At a time t7, the read is completed, and the data D2 becomes available on the Dout terminals. At about the same time, the user issues another read command Rd3 on the CMD lines. Therefore, a refresh is suppressed. The Rd2 read cycle lasts from t6 to t7 as viewed on the CMD lines, and is a short cycle.

At a time t8, the Rd3 read is completed, and the data D3 becomes available on the Dout terminals. No new command is received on the CMD lines at this time, so the memory performs a refresh operation Rfrsh2, which ends at t9. The Rd3 read cycle is a long cycle. It lasts from t7 to at least t9. This cycle may extend past t9 if the user does not supply a new command at t9.

Many variations of this timing are possible. In some memories, the read data timing is such that, for example, the data D1 would be provided before or after the time t3 (before or after the start of the refresh operation), and D2 would be provided before or after t7. Also, in some memories unchanged command lines may indicate that the memory should continue execution of a previously started burst command.

In some memories, a refresh may be initiated at the end of a read, write, read-modify-write, or other types of memory access operations (the invention is not limited to any particular types of memory access operations). In other memories, a refresh may be initiated at the end of some types of operations but not others. For example, in some memories, a refresh can be initiated at the end of a read operation but not at the end of a write operation. This may be desirable in PSRAMs in order to make the write cycle timing more like that of an SRAM. Some SRAMs require the write data to be provided to the memory at the end of the write cycle. If the PSRAM could initiate a refresh at the end of a write operation, and the user chose to perform a "long" write cycle, then the data in the long write cycle would have to be provided before the refresh, in the middle of the long write cycle. This would make the write cycle timing less like that of the SRAM. Therefore, some embodiments do not initiate a refresh at the end of write operations. The invention is not limited to such embodiments however.

In some embodiments, the refresh can also be initiated when the memory is disabled.

Now one PSRAM embodiment will be described that emulates an asynchronous SRAM. The memory interface signals are shown in the following table:

TABLE 1

| | |
|---|---|
| CE\ | Chip Enable Input |
| OE\ | Output Enable Input |
| WE\ | Write Enable Input |
| A0-AN | Address Inputs (N + 1 terminals) |
| $I/O_1$–$I/O_{16}$ | Data Inputs/Outputs |
| UB\ | Upper Byte Input (indicates that the $I/O_{9-16}$ terminals are to carry read or write data) |
| LB\ | Lower Byte Input (indicates that the $I/O_{1-8}$ terminals are to carry read or write data) |

The memory may have other interface signals, e.g. power and ground. Another example is chip select (CS) for entry into deep power down mode. This mode does not guarantee data retention, so no refresh has to be performed in this mode.

The truth table is as follows:

TABLE 2

| Mode | CE\ | OE\ | WE\ | UB\ | LB\ | $I/O_{9-16}$ | $I/O_{1-8}$ |
|---|---|---|---|---|---|---|---|
| Output Disable | L | X | X | H | H | High Z | High Z |
| Output Disable | L | H | H | X | X | High Z | High Z |
| Read | L | L | H | L | L | Dout | Dout |
| Read | L | L | H | L | H | Dout | High Z |
| Read | L | L | H | H | L | High Z | Dout |
| Write | L | X | L | L | L | Din | Din |
| Write | L | X | L | L | H | Din | High Z |
| Write | L | X | L | H | L | High Z | Din |
| Standby | H | X | X | X | X | High Z | High Z |

"H" means "high" (high voltage). "L" means "low". "X" means "don't care". "High Z" means "high impedance". "Dout" means output data (read data). "Din" means input data (write data). CS (chip select) is not shown. When CS is low, the remaining inputs are ignored, the $I/O_{1-16}$ terminals are in high impedance, and the memory is in deep power down mode.

When a refresh is pending, it is performed according to the following rules:

TABLE 3

Rule 1 - A refresh is initiated at the conclusion of a read operation if:
(i) no new command has been received at the conclusion of the read; and
(ii) the read was initiated by a new address on the address lines A0-AN, or
by asserting CE\ or UB\ or LB\; and
(iii) CE\ is low and either UB\ or LB\ (or both) are low.
Rule 2. In addition, a refresh is initiated as soon as it becomes pending if the memory is disabled, i.e. the following "disable" condition is true:
CE\ is high, and/or both UB\ and LB\ are high.
When this condition becomes false, the user is required to either (a) delay issue of any command to the memory to allow any refresh in progress to finish, or (b) perform a long read cycle before issuing any other command. In some embodiments, the user also has an option of performing a long write cycle before issuing any other command. In the long write cycle, the user must provide data to the memory with a delay sufficient to accommodate any refresh in progress.

Figure 2:
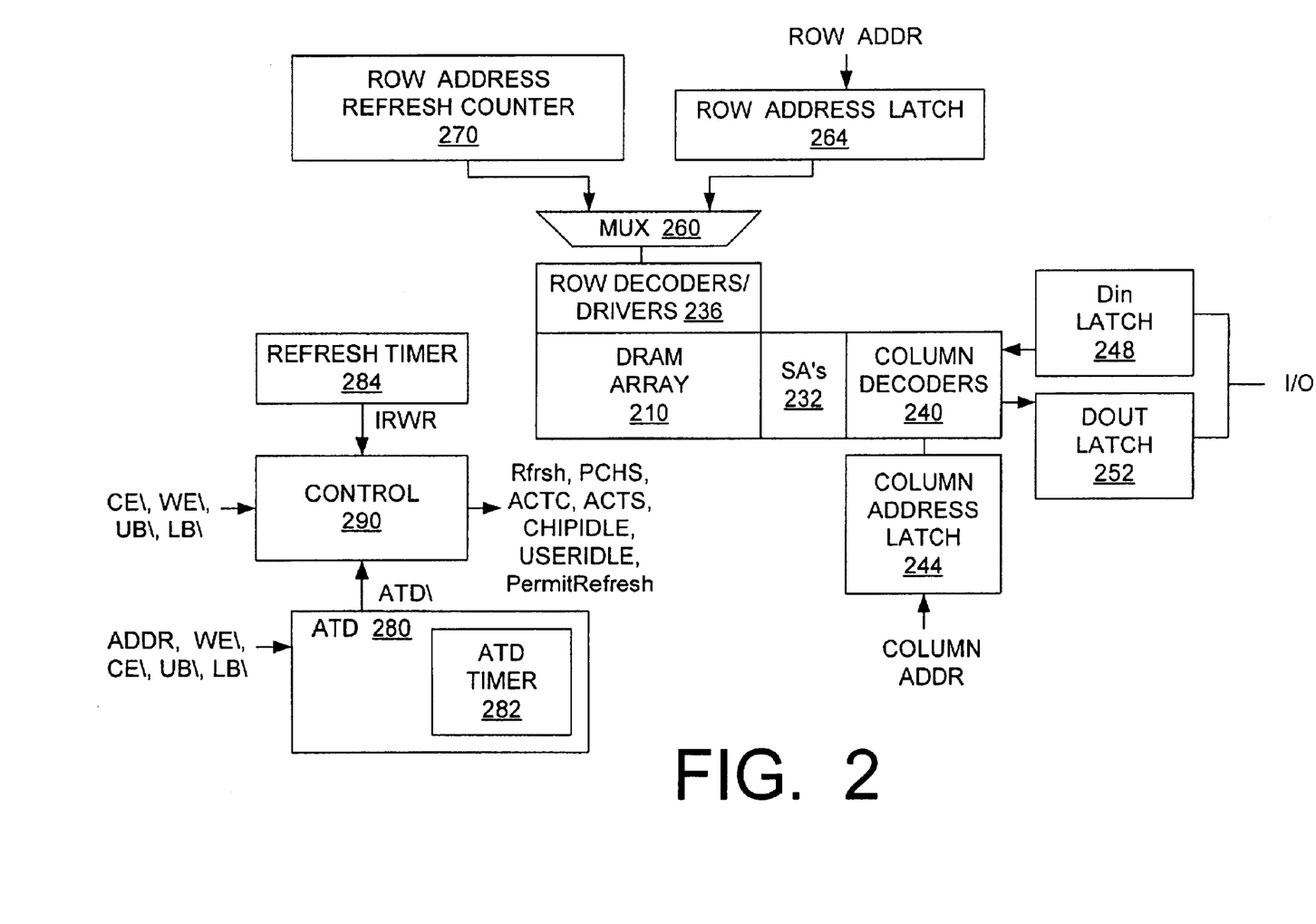
FIG. 2 is a block diagram of one memory embodiment of the present invention.
Figure 3:
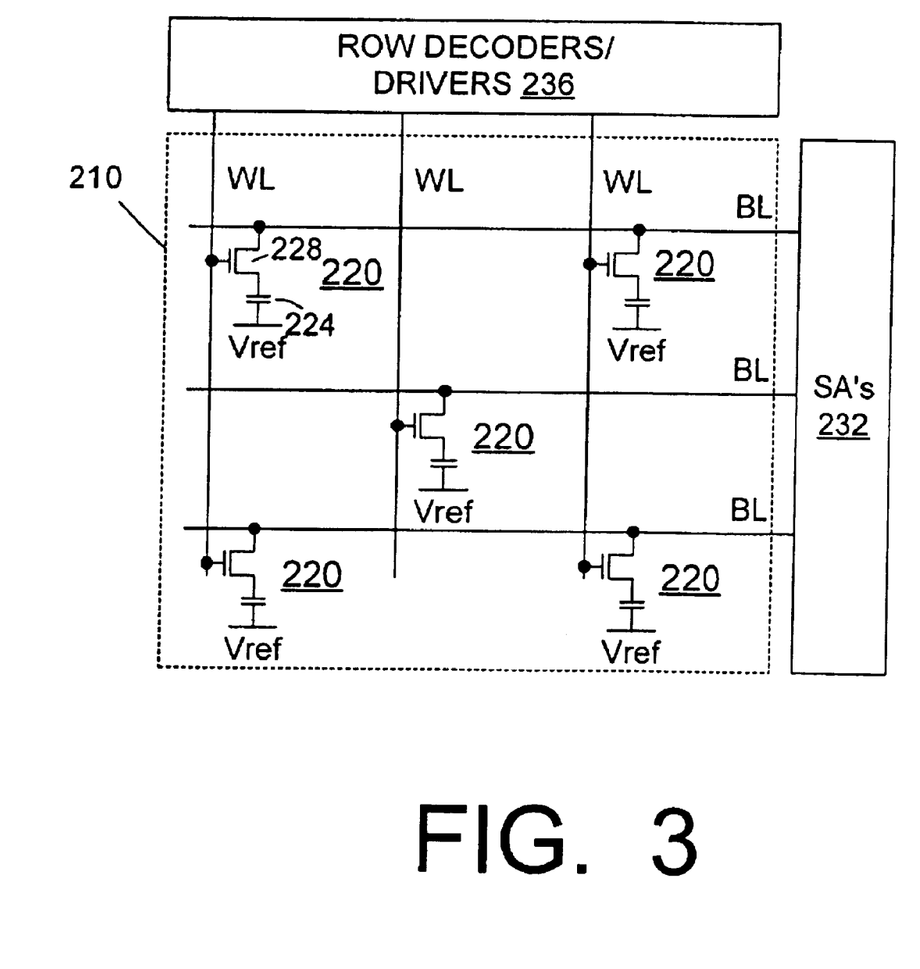
FIG. 3 is a block/circuit diagram for one memory embodiment of the present invention.

FIG. 2 is a block diagram of the memory. DRAM array 210 is shown in more detail in FIG. 3. Each DRAM cell 220 includes a capacitor 224 and an NMOS transistor 228. The gate of the transistor is connected to a word line (WL). One of the transistor's source/drain terminals is connected to a bit line (BL). The other source/drain terminal is connected to a plate of capacitor 224. The other plate of the capacitor is held at a constant voltage Vref. Each word line WL is connected to one row of cells 220, and each bit line BL is connected to one column of cells 220. The bit lines are connected to sense amplifiers 232. The word lines are driven by row decoder and word line driver circuit 236. See the following patents incorporated herein by reference: U.S. Pat. No. 5,767,737 entitled "METHODS AND APPARATUS FOR CHARGING A SENSE AMPLIFIER" issued Jun. 16, 1998 to Liu et al.; U.S. Pat. No. 5,889,414 entitled "PROGRAMMABLE CIRCUITS", issued Mar. 30, 1999 to Li et al.; U.S. Pat. No. 6,298,000 entitled "DYNAMIC TYPE SEMICONDUCTOR MEMORY DEVICE OPERABLE IN SELF REFRESH OPERATION MODE AND SELF REFRESH METHOD THEREOF" issued Oct. 2, 2001 to Kitade et al. Other memory cell and array structures can also be used, including a four transistor DRAM cell disclosed in U.S. Pat. No. 6,285,578 entitled "HIDDEN REFRESH PSEUDO SRAM AND HIDDEN REFRESH METHOD" issued Sept. 4, 2001 to Huang, incorporated herein by reference.

Sense amplifiers 232 are connected to column decoders 240 (FIG. 2). Decoders 240 select a memory column or columns in response to the column address signals provided through column address latch 244. The column address signals are a subset of address signals A0–AN. The column decoders receive the write data Din from latch 248, and provide read data to latch 252. Latches 248, 252 are connected to the common I/O data terminals $I/O_1-O_{16}$.

Row decoder and word line driver block 236 receives the row address (a subset of the address signals A0–AN) from multiplexer 260. Multiplexer 260 selects the row address from latch 264 for non-refresh operations, and from refresh address counter 270 for refresh operations. Latch 264 receives the row address from the row address subset of lines A0–AN.

ATD (Address Transition Detection) circuit 280 drives its output signal ATD\ low if CE\ is low, one or both of UB\ and LB\ are low, and an address transition occurs on the address lines A0–AN. More particularly, ATD\ is driven low on any of the following events:

(a) Address transition.
(b) CE\ goes from high to low, and (UB\*LB\)'=1. Here 1 is used to indicate a high level, *indicates the AND operation, and the quote 'indicates inversion, so (UB\*LB\)'=NAND(UB\, LB\).
(c) CE\=L and (UB\*LB\)' goes from low to high.

When ATD\ goes low (i.e. a high to low transition occurs), ATD timer 282 is started. If the timer expires, then ATD\ returns to the high level. If any of the conditions (a), (b), (c) occurs again before the timer expires, then ATD\ will stay low, and the timer 282 will be restarted. In an exemplary embodiment being described, the period of timer 282 is 20 ns (the timer expires 20 ns after being started).

A refresh can be suppressed by a high to low transition of ATD\. The user does not have to meet the setup timing requirements (the setup requirements are satisfied when ATD\ returns to the high level).

In this embodiment, the memory has a number of memory arrays 210. Each array has its own word lines and bit lines, and its own sense amplifiers 232. Each array has 8K rows. Each row address corresponds to one row in each array. The rows at the same address are refreshed simultaneously. Refresh counter 270 simultaneously provides the refresh address to all of the arrays. The refresh operation is conventional. For example, if the DRAM cells are one transistor/one capacitor cells as in FIG. 3, the rows are read out to the bit lines BL as the corresponding word lines WL are driven high. The bit line data are amplified by sense amplifiers 232, and written back to cells 220 in the same row. The memory data retention time is 85 ms. Therefore, 8K refresh operations have to be performed in 85 ms, or one refresh operation in about 85 ms/8K=10.3 µs.

Refresh timer 284 generates a pulse every 9 µs. At each pulse, signal IRWR is driven high. IRWR returns to the low level when a refresh is completed.

Signals IRWR, ATD\, CE\, WE\ are provided to control circuit 290 which generates control signals described below.

Figure 4:
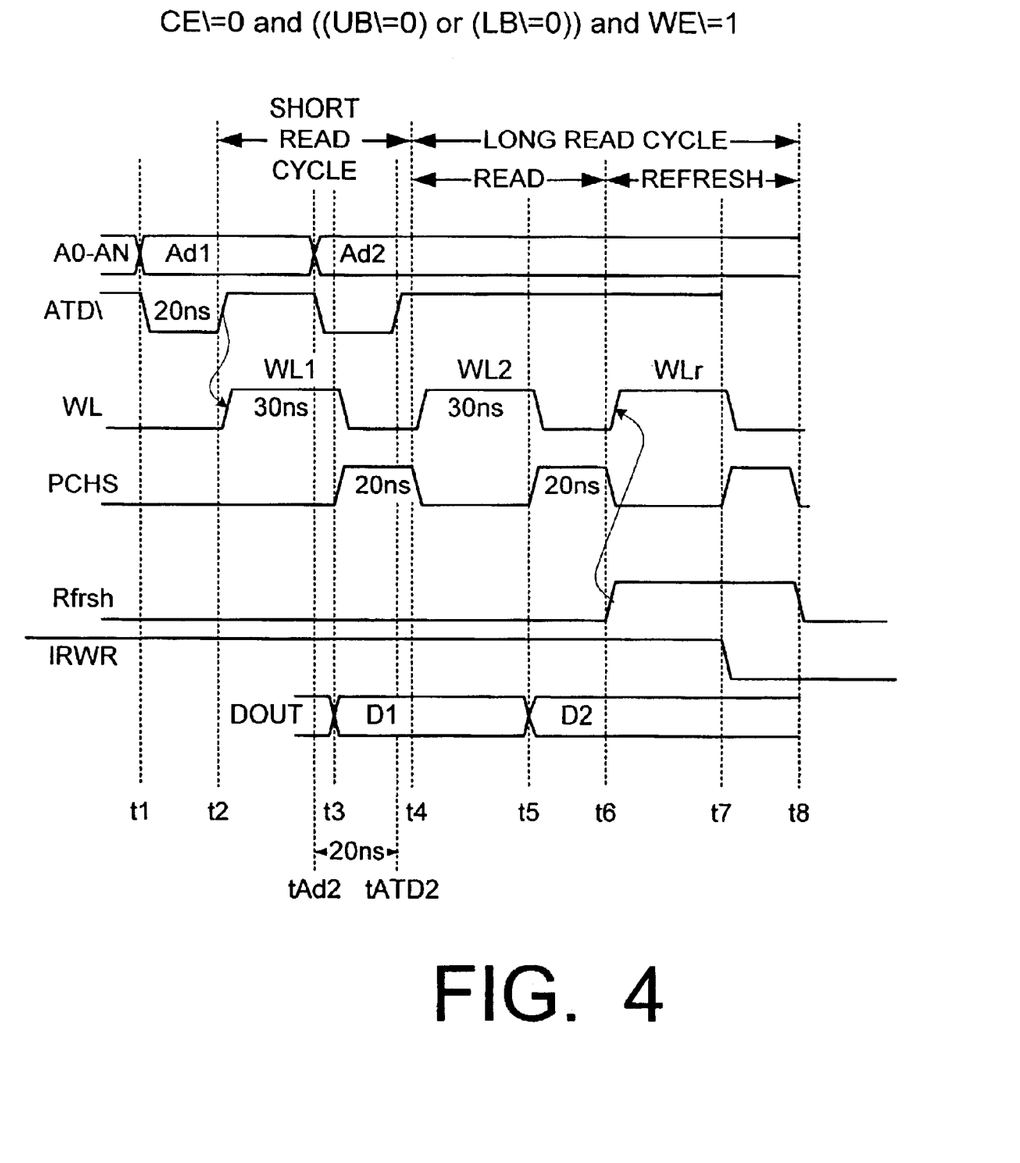
FIGS. 4 and 5 are timing diagrams for embodiments of the present invention.

FIG. 4 illustrates read operation timing for the case when read operations are initiated by address changes. CE\ is assumed to be low throughout, either UB\ or LB\ or both are low, and WE\ is high.

At a time t1, the address signals change to some address Ad1. Signal ATD\ becomes low. The address signals remain steady for 20 ns as measured by ATD timer 282. At the end of the 20 ns period, at a time t2, the signal ATD\ returns to high, and a read operation is initiated. The corresponding word line WL1 is driven high for 30 ns (by circuit 236). The memory cells of the selected row are read out to the bit lines BL. The bit line signals are amplified by sense amplifiers 232 and written back to the memory cells. Column decoders 240 provide the amplified data from the desired column to latch 252. Latch 252 drives these data D1 on terminals $I/O_1-I/O_{16}$ starting at some time t3=t1+50 ns. Word line WL1 is deactivated at about the same time t3.

The Ad1 read cycle starts at time t2, when the read operation is initiated. The time between t1 and t2 is the address setup time.

At time t3, the control circuit 290 asserts a precharge signal PCHS to precharge the bit lines BL to a predetermined voltage. Bit line precharge will reduce the time needed to provide desired bit line voltages in a subsequent memory access operation, as known in the art. The precharge lasts 20 ns. At the end of the precharge, at time t4=t2+50 ns, signal PCHS becomes low.

Signal IRWR is high at time t1, indicating a refresh is pending. At some time tAd2 which is at least 20 ns before t4, the address signals A0–AN change to a new address Ad2. Signal ATD\ becomes low. The high to low transition of ATD\ is remembered via a signal PermitRefresh (FIG. 5) described below. Twenty nanoseconds later, at time tATD2= tAd2+20 ns, signal ATD\ becomes high. At time t4, control circuit 290 checks PermitRefresh, and since PermitRefresh is low, the refresh signal Rfrsh remains low indicating that a refresh is not initiated at this time. Instead, a read operation at address Ad2 is performed. The corresponding word line WL2 is driven high at time t4, then low at time t5=t4+30 ns. At t5, the read data D2 appear on the I/O terminals. Also, a precharge is initiated at this time. The precharge completes 20 ns later, at time t6.

There was no address change between t4 and the time point 20 ns before t6. (This time point happens to coincide with t5 because in this embodiment the precharge time and the period of the ATD timer 282 are of equal duration. These periods are of different durations in some other embodiments.) As a result, PermitRefresh is high at time t6 (PermitRefresh went high at time t4 when word line WL2 was activated). Control circuit 290 drives signal Rfrsh high to initiate a refresh. The corresponding refresh word line WLr selected by refresh counter 270 is driven high for 30 ns, then low at time t7=t6+30 ns. Precharge is initiated at t7, and completes at t8=t7+20 ns. As a result, Rfrsh goes low at t8, causing the signal IRWR to become low.

Figure 5:
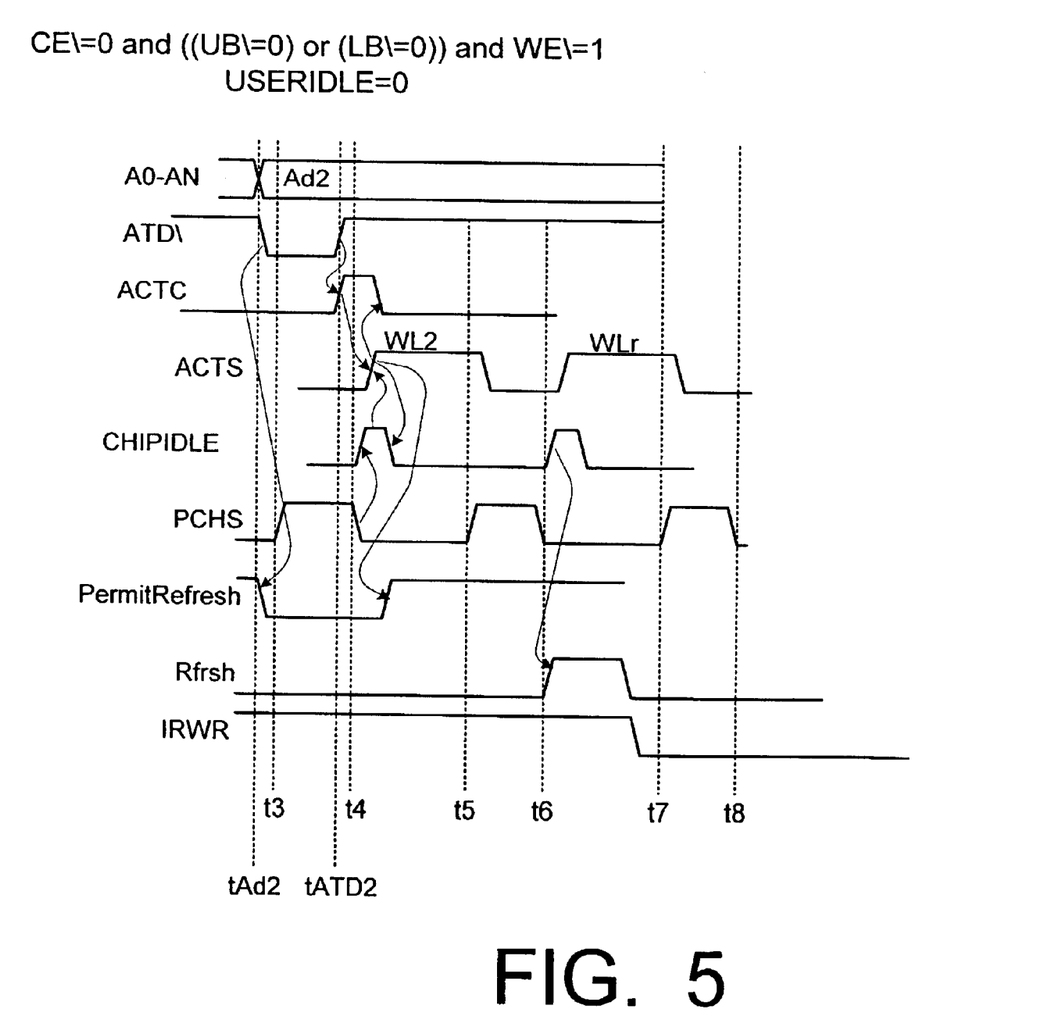

FIG. 5 shows other timing particulars. A more complete signal description is provided in the following Table 4. In this table, H means high, and L means low. Also, 1 means high, 0 means low.

TABLE 4

Refresh Related Signals

ATD\ becomes low if CE\ is low, one or both of UB\ and LB\ are low, and an address transition occurs on the address lines A0–AN. More particularly, ATD\ is driven low on any of the following events:
(a) Address transition.
(b) CE\ goes from high to low, and (UB\ * LB|)' = 1. Here 1 is used to indicate a high level, * indicates the AND operation, and the quote ' indicates inversion, so (UB\ * LB\)' = NAND(UB\, LB\).
(c) CE\ = L and (UB\ * LB\) goes from low to high.
USERIDLE = (CE\ = 1) or (UB\ = LB\ = 1)
CHIPIDLE = (ACTS = 0) and (PCHS = 0)
As described below, ACTS = 1 means a word line is on (i.e. high). Therefore, CHIPIDLE = 1 means all the wordlines are off and a precharge is not in progress.
PermitRefresh = Low if
(pr-i) ATD\ goes low when CHIPIDLE = 0 and Rfrsh = 0, or
(pr-ii) Write cycle was initiated.
PermitRefresh goes high (i.e. a low to high transition occurs) when
(pr-iii) Read cycle was initiated by an address transition or by enabling the memory (enabling the memory corresponds to a high to low transition of USERIDLE), and
(pr-iv) the conditions pr-i and pr-ii are false.
Note: Signal Rfrsh goes high (i.e. a low to high transition occurs) on the rising edge of CHIPIDLE if PermitRefresh is high.
ACTC (active command request) -- keeps track of the rising edge of ATD\:
1) ACTC goes high as a result of ATD\ low to high transition if USERIDLE = 0.
2) ACTC goes low as a result of ACTS going high if a refresh cycle is not in progress (Rfrsh is low).
3) ACTC is low if USERIDLE is high.
4) ACTC goes low as a result of ATD\ going low.
ACTS (active state, i.e. a word line is on):
1) ACTS goes high when the following condition becomes true: ACTC is high and CHIPIDLE = 1 and USERIDLE = 0.
2) ACTS goes high when a refresh cycle starts (Rfrsh goes high).
3) ACTS goes low when a precharge starts (PCHS goes high).
Address latching rules:
Row address is latched by latch 264 when ACTS goes high in a non-refresh operation.
Row address is unlatched when ACTS goes low.
Column address is latched by latch 244 when WE\ goes low.

In FIG. 5, CE\ is assumed to be low throughout, either UB\ or LB\ or both are low, and WE\ is high, as in FIG. 4. Therefore, USERIDLE=0. At time tAd2, the address signals change to Ad2. ATD\ goes low, and PermitRefresh also goes low (see PermitRefresh condition pr-i in Table 4). At time tATD2, ATD\ goes high. Therefore, ACTC goes high (see ACTC condition 1 in Table 4). CHIPIDLE is low until the precharge completion at time t4. ACTS is low during precharge because the word lines are off. CHIPIDLE goes high at t4. PermitRefresh is low, so refresh is not initiated. The memory performs a read operation at address Ad2. ACTS goes high for word line activation (see ACTS condition 1 in Table 4), and CHIPIDLE becomes low.

When ACTS goes high at t4, PermitRefresh becomes high (conditions pr-iii, pr-iv) and remains high through at least the time t6 due to no change on the address lines. At t6, CHIPIDLE goes from low to high (due to the precharge completion). Since PermitRefresh is high, IRWR is high, and CHIPIDLE becomes high, Rfrsh is asserted to begin a refresh.

The timing is similar if the low to high transition of ATD\ is caused by the assertion of CE\, UB\, or LB\.

As illustrated in FIGS. 4 and 5, a read cycle can be long or short. A read cycle is viewed as the period between the time that the memory initiates execution of a read command to the time the memory initiates execution of the next command. The command execution or the refresh can be viewed as initiated when the corresponding word line is driven high. The Ad1 read cycle in FIG. 4 lasts from t2 to t4. This is a short read cycle, of a 50 ns duration. The Ad2 read cycle lasts from t4 to at least t8. This is a long read cycle, of a 100 ns or greater duration.

The read cycles and the command initiation can be defined in some other way. The definitions above have been chosen for convenience of description and not to limit the invention.

The user may perform short read cycles back to back by delivering a new address on the address lines every 50 ns or more frequently. The new address will cause ATD\ to go low, but a subsequent address may be delivered to the memory before ATD\ becomes high. Address Ad2 can be provided up to the time t4=t2+50 ns to suppress a refresh. The next address could be provided at t6=t4+50 ns (so the refresh would be suppressed), and so on.

If the user does not change the address signals 50 ns after the start of a read cycle, the user should not issue any command for 100 ns after the start of the read, to make the read cycle "long", in case a refresh is pending. The 100 ns minimum cycle time will insure that the execution of the next command after the read will not be delayed by a refresh if a refresh was pending at the end of the read operation (at the completion of the precharge).

To ensure that the memory is properly refreshed and the memory access operations are not delayed by the refresh operations, the user can operate the memory according to the following rules. At least once in some predetermined interval of time, e.g. once in every 4 μs, the user should either (i) perform a long read cycle, or (ii) disable the memory by setting CE\=1 and/or UB\=LB\=1 (USERIDLE=1). If the memory is disabled for any reason and for any interval of time, and then enabled, then the user should either: (a) delay issue of any command to the memory for at least 50 ns to allow any refresh in progress to finish, or (b) perform a long read cycle before issuing any other command. If the long read cycle is performed immediately after the memory is enabled, the read data are guaranteed to be provided on the I/O terminals only 100 ns after the address. In any other long read cycle, the data are provided with the same timing as in a short read cycle (50 ns after the address).

In some embodiments, instead of performing a long read cycle, the user has an option of performing a long write cycle. In the long write cycle, the user must provide data to the memory with a delay sufficient to accommodate any refresh that may be in progress when the write command is issued.

When a read cycle has started (a read operation has been initiated), the user must either:

(A) Provide new command signals (e.g. read or write signals), or disable the memory, within 50 ns after the initiation of the read operation. For example, if the current read cycle was issued by an address transition, the user can provide a new address (for a new read) 20 ns to 70 ns after the previous address. In this case, the read cycle will be short.

(B) Alternatively, the user must not provide new command signals for at least 80 ns after the read cycle starts. After 80 ns, the user may provide new command signals to issue a new command (the command will be issued after 100 ns, when ATD\ goes high). The read cycle will be long.

Alternatively, the user may operate the memory with simpler timing constraints as follow:

(I) At least every 4 μs, perform either a long read cycle or disable the memory for at least 100 ns.

(II) The user can issue a new command at any time. For example, a new read command can be issued 60 ns after the previous read command. The new read execution may be delayed, but the data will be available in 100 ns.

(III) In every read cycle, assume that the read data will be available 100 ns after the address. Disregard the possibility that the read data may be available earlier.

It is noted that if the condition (II) is repeated, i.e. the user repeatedly issues new read commands at intervals of time that are greater than 50 ns and less than 100 ns, the read execution delays will not accumulate. This is because a delay due to a refresh can occur only once in every 9 $\mu$s period (as measured by refresh timer 282). Therefore, there can be only one read delay in each 9 $\mu$s period. Due to condition (i), when a long read occurs or the memory is disabled for at least 100 ns, the delay will be eliminated (the next read command execution will start without a delay).

The embodiments described above do not limit the invention. The invention is not limited to any timing parameters or data retention times. Also, in some embodiments, refresh operations in different arrays may proceed at different times. The invention is defined by the appended claims.

What is claimed is:

1. A memory circuit comprising:

a plurality of memory cells that need to be refreshed from time to time; circuitry for:

receiving commands to perform memory access operations;

for at least each command of a first type:

performing a memory access operation specified by the command;

at a predetermined time defined by the memory access operation, if a refresh is pending, then:

(A) if the memory circuit has received an indication of a new command following the command of the first type, then not performing the refresh to leave the memory circuit available for executing the new command;

(B) if the memory circuit has not received an indication of a new command following the command of the first type, then performing the refresh.

2. The memory circuit of claim 1 wherein an indication of a new command is received when the memory circuit detects command signals identifying the new command regardless of whether or not the command signals remain stable after being detected.

3. The memory circuit of claim 1 wherein:

an indication of a new command is received when the memory circuit detects that command signals identifying the new command have arrived and remained stable for a predetermined interval of time; and in the case (A) recited in claim 1, the circuitry is to execute the new command.

4. The memory circuit of claim 1 wherein said predetermined time defined by the memory access operation is either at the end of the memory access operation or a predetermined time after initiation of the memory access operation.

5. The memory circuit of claim 1 wherein the operation (B) is operable to be performed only for the commands of the first type.

6. The memory circuit of claim 5 wherein the commands of the first type are read commands.

7. The memory circuit of claim 5 wherein the commands of the first type include read commands issued by changing one or more of address input signals and also include read commands issued by enabling the memory circuit after the memory circuit was disabled but was to retain data while being disabled, but the commands of the first type do not include read commands issued by changing the memory circuit's write enable input.

8. The memory circuit of claim 5 wherein as long as the memory circuit is enabled to execute the commands of the first type, the refresh is operable to be performed only in operations (B).

9. A method comprising:

receiving commands to access a memory comprising a plurality of memory cells that need to be refreshed from time to time;

for at least each command of a first type:

performing a memory access operation specified by the command;

at a predetermined time defined by the memory access operation, if a refresh is pending, then:

(A) if the memory circuit has received an indication of a new command following the command of the first type, then not performing the refresh to leave the memory circuit available for executing the new command;

(B) if the memory circuit has not received an indication of a new command following the command of the first type, then performing the refresh.

10. The method of claim 9 wherein an indication of a new command is received when the memory circuit detects command signals identifying the new command regardless of whether or not the command signals remain stable after being detected.

11. The method of claim 9 wherein:

an indication of a new command is received when the memory detects that command signals identifying the new command have arrived and remained stable for a predetermined interval of time; and the method further comprises, in the case (A), executing the new command.

12. The method of claim 9 wherein said predetermined time defined by the memory access operation is either at the end of the memory access operation or a predetermined time after initiation of the memory access operation.

13. The method of claim 9 wherein the operation (B) is performed only for the commands of the first type.

14. The method of claim 13 wherein the commands of the first type are read commands.

15. The method of claim 13 wherein the commands of the first type include read commands issued by changing one or more of address input signals and also include read commands issued by enabling the memory after the memory was disabled but was to retain data while being disabled, but the commands of the first type do not include read commands issued by changing the memory's write enable input.

16. The method of claim 13 wherein as long as the memory is enabled to execute the commands of the first type, the refresh is performed only in operations (B).

17. A method for operating a memory that comprises a plurality of memory cells that need to be refreshed from time to time, the method comprising issuing commands to access the memory, wherein at least each command C1 of a first type is issued in either:

a long memory cycle, the long cycle being a cycle in which no indication of a new command is delivered to the memory for a while to allow the memory sufficient time to perform both a memory access operation specified by the command C1 and also to perform a refresh operation; or a short memory cycle, the short cycle being a cycle in which an indication of a new command is delivered to the memory early enough to block the memory from performing a refresh operation immediately after the command C1.

18. The method of claim 17 wherein an indication of a new command is delivered to the memory when command signals identifying the new command are delivered to the memory regardless of whether or not the command signals remain stable after being delivered.

19. The method of claim 17 wherein an indication of a new command is delivered to the memory when command signals identifying the new command are delivered to the memory and held stable for a predetermined interval of time.

20. The method of claim 17 further comprising issuing the commands of the first type to perform a long cycle at least once in each predetermined interval of time to allow each of said memory cells to be refreshed sufficiently frequently to prevent data loss.

21. The method of claim 17 further comprising, at least once in each predetermined interval of time, either issuing the commands of the first type to perform a long cycle or disabling the memory to allow each of said memory cells to be refreshed sufficiently frequently to prevent data loss, wherein the memory retains data while being disabled.

22. A system comprising:

a memory comprising a plurality of memory cells that need to be refreshed from time to time;

circuitry for issuing commands to access the memory, wherein at least each command C1 of a first type is issued so as to perform either:

a long memory cycle, the long cycle being a cycle in which no indication of a new command is delivered to the memory for a while to allow the memory sufficient time to perform both a memory access operation specified by the command C1 and also to perform a refresh operation; or a short memory cycle, the short cycle being a cycle in which an indication of a new command is delivered to the memory early enough to block the memory from performing a refresh operation immediately after the command C1.

23. The system of claim 22 wherein an indication of a new command is delivered to the memory when command signals identifying the new command are delivered to the memory regardless of whether or not the command signals remain stable after being delivered.

24. The method of claim 22 wherein an indication of a new command is delivered to the memory when command signals identifying the new command are delivered to the memory and held stable for a predetermined interval of time.

25. The system of claim 22 wherein the circuitry is to issue the commands of the first type to perform a long cycle at least once in each predetermined interval of time to allow each of said memory cells to be refreshed sufficiently frequently to prevent data loss.

26. The system of claim 22 wherein, at least once in each predetermined interval of time, the circuitry is to either issue the commands of the first type to perform a long cycle or disable the memory to allow each of said memory cells to be refreshed sufficiently frequently to prevent data loss, wherein the memory is to retain data while being disabled.

* * * * *